(12) United States Patent
Nakamura (10) Patent No.: US 6,337,732 B2
(45) Date of Patent: *Jan. 8, 2002

(54) EXPOSURE APPARATUS AND DEVICE MANUFACTURING METHOD USING THE SAME IN WHICH A DOOR LOCK MECHANISM IS CONTROLLED ON THE BASIS OF TEMPERATURE AND AN OPERATION SEQUENCE

(75) Inventor: Gen Nakamura, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/337,655

(22) Filed: Jun. 22, 1999

(30) Foreign Application Priority Data

Jun. 30, 1998 (JP) .......................................... 10-198105

(51) Int. Cl.[7] ........................ G03B 27/52; G03B 27/54; G03B 27/72

(52) U.S. Cl. ............................... 355/30; 355/67; 355/69
(58) Field of Search ............................. 355/30, 67, 69; 358/475; 353/74; 292/6, 7, 144; 352/198

(56) References Cited

U.S. PATENT DOCUMENTS 5,829,855 A * 11/1998 Uchiyama .................... 353/74
6,043,906 A * 3/2000 Kikuchi ....................... 358/475

* cited by examiner

Primary Examiner—Russell Adams
Assistant Examiner—Peter B. Kim
(74) Attorney, Agent, or Firm—Fitzpatrick, Cella, Harper & Scinto

(57) ABSTRACT

An exposure apparatus has a maintenance door for an exposure illumination lamp. The apparatus includes a detector for detecting temperature information of the lamp and for outputting the detected temperature information, a confirmation device for confirming a stop of an operation sequence of the exposure apparatus and for outputting a confirmation result and a controller for controlling a lock mechanism of the maintenance door on the basis of the temperature information and the confirmation result.

12 Claims, 8 Drawing Sheets

SEMICONDUCTOR DEVICE MANUFACTURING FLOW

FIG. 8

WAFER PROCESS

ND DEVICE
EXPOSURE APPARATUS AND DEVICE MANUFACTURING METHOD USING THE SAME IN WHICH A DOOR LOCK MECHANISM IS CONTROLLED ON THE BASIS OF TEMPERATURE AND AN OPERATION SEQUENCE

BACKGROUND OF THE INVENTION

The present invention relates to an exposure apparatus used for manufacturing semiconductor devices and to a device manufacturing method using the exposure apparatus.

In recent years, large-scaled semiconductor manufacturing equipment and facilities have been built for the purpose of improving the production efficiency. In addition, to improve the operation efficiency of apparatuses, the operation time of semiconductor manufacturing apparatuses is getting longer. Under these circumstances, to prolong the operation time of semiconductor exposure apparatuses themselves, illumination lamps used for exposure have been examined to improve their service life. Although the service life of lamps is recently increasing, lamps are exchange components. To keep operating the apparatus, the lamp must be periodically exchanged, though the exchange period has become longer.

Conventionally, a lamp in a semiconductor exposure apparatus is turned on for a predetermined time and then turned off, and the operator waits for a predetermined time until the temperature of the lamp itself drops and then exchanges the lamp. Alternatively, the temperature of a lamp is always monitored, and the lamp is exchanged after a decrease in temperature of the lamp is confirmed.

However, in the method of exchanging the lamp after a predetermined time, the operator waits for the predetermined time independently of the temperature of the lamp. For this reason, the maintenance time (lamp exchange time) of the apparatus prolongs to waste the apparatus stop time, resulting in a decrease in apparatus operation efficiency. When the lamp temperature is always monitored, and the lamp is exchanged after confirmation of a decrease in lamp temperature, the operator devotes himself/herself to the apparatus whose lamp needs to be exchanged because the lamp temperature must be always confirmed without waiting for a predetermined time. This increases the load on the operator, resulting in a decrease in operation efficiency. In addition, since the temperature of a lamp at high temperature needs to be confirmed, the operator may get burnt during confirmation.

SUMMARY OF THE INVENTION

The present invention has been made in consideration of the above conventional problems, and has as its first object to provide an exposure apparatus whose operation efficiency is improved by minimizing the lamp exchange time and minimizing the device production stop time, and a device manufacturing method using the exposure apparatus. It is the second object of the present invention to allow an operator to confirm the lamp exchange time without devoting himself/herself to the apparatus requiring lamp exchange, thereby decreasing the operation load on the operator and improving the operation efficiency. It is the third object of the present invention to prepare an environment for ensuring safety during operation by preventing any accident such as a burn even in a case of operation error by the operator.

In order to achieve the above objects, an exposure apparatus of the present invention, or a device manufacturing method of manufacturing a semiconductor device using the exposure apparatus is characterized by the following arrangement.

An exposure apparatus having a maintenance door for an exposure illumination lamp comprises means for detecting temperature information of the lamp, means for confirming a stop of an operation sequence of the exposure apparatus and outputting the confirmation result, and means for notifying an operator of an appropriate time for exchanging the lamp on the basis of the temperature information and the confirmation result.

With this arrangement, the operator can know the lamp exchange operation time by referring to the lamp temperature information without devoting himself/herself to the apparatus which requires lamp exchange. Hence, the lamp exchange time and apparatus stop time can be minimized, and the apparatus operation efficiency can be improved. In addition, since the exchange operation is started after the stop of the sequence is confirmed on the basis of the sequence stop information, the exchange operation can be performed without any risk of an accident even in a case of operation error by the operator.

An exposure apparatus having a maintenance door for an exposure illumination lamp comprises means for detecting temperature information of the lamp, and means for notifying an operator of an appropriate time for exchanging the lamp on the basis of the temperature information.

With this arrangement, since the exchange operation is performed by opening the maintenance door in accordance with an indication on an the indicator, the operator can know the lamp exchange time and perform the exchange operation without devoting himself/herself to the apparatus that requires lamp exchange. Hence, the lamp exchange time and apparatus stop time can be minimized, and the apparatus operation efficiency can be improved.

Additionally, the exchange operation can be performed without any risk of a burn even in a case of operation error by the operator.

An exposure apparatus having a maintenance door for an exposure illumination lamp comprises lock means for the door, and the lock means actively locks or unlocks the door on the basis of a change in temperature in an ON or OFF state of the illumination lamp.

Since the door is locked or unlocked using only the energy generated by the shrinkage difference due to a "change in temperature" as a driving source of the lock means without receiving any external energy, the safety of an exchange operation can be improved with an inexpensive arrangement.

A device manufacturing method comprises the steps of providing an exposure apparatus, and manufacturing a device by exposure using the exposure apparatus.

According to this method, a device can be efficiently and safely manufactured by improving the efficiency and safety of the lamp exchange.

According to a preferred aspect of the present invention, the exposure apparatus further comprises means for controlling a lock mechanism of the door on the basis of the detected temperature information.

According to a preferred aspect of the present invention, the lock mechanism of the exposure apparatus comprises an air cylinder as a driving source.

According to a preferred aspect of the present invention, the lock mechanism of the exposure apparatus comprises a DC actuator as a driving source.

According to a preferred aspect of the present invention, the exposure apparatus further comprises means for controlling a lock mechanism of the door on the basis of the detected temperature information.

According to a preferred aspect of the present invention, the means for detecting the temperature information in the exposure apparatus detects a temperature of the lamp or at a portion where the lamp is exchanged using a sensor as the temperature information.

According to a preferred aspect of the present invention, the lock means of the exposure apparatus actively locks or unlocks the door when a member shrinks or expands and deforms due to a change in temperature.

According to a preferred aspect of the present invention, the exposure apparatus further comprises means for detecting the change in temperature in the ON or OFF state of the illumination lamp, and means for notifying an operator of an appropriate time for exchanging the lamp on the basis of the detection result.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described in detail in accordance with the accompanying drawings.

(First Embodiment)

Figure 1:
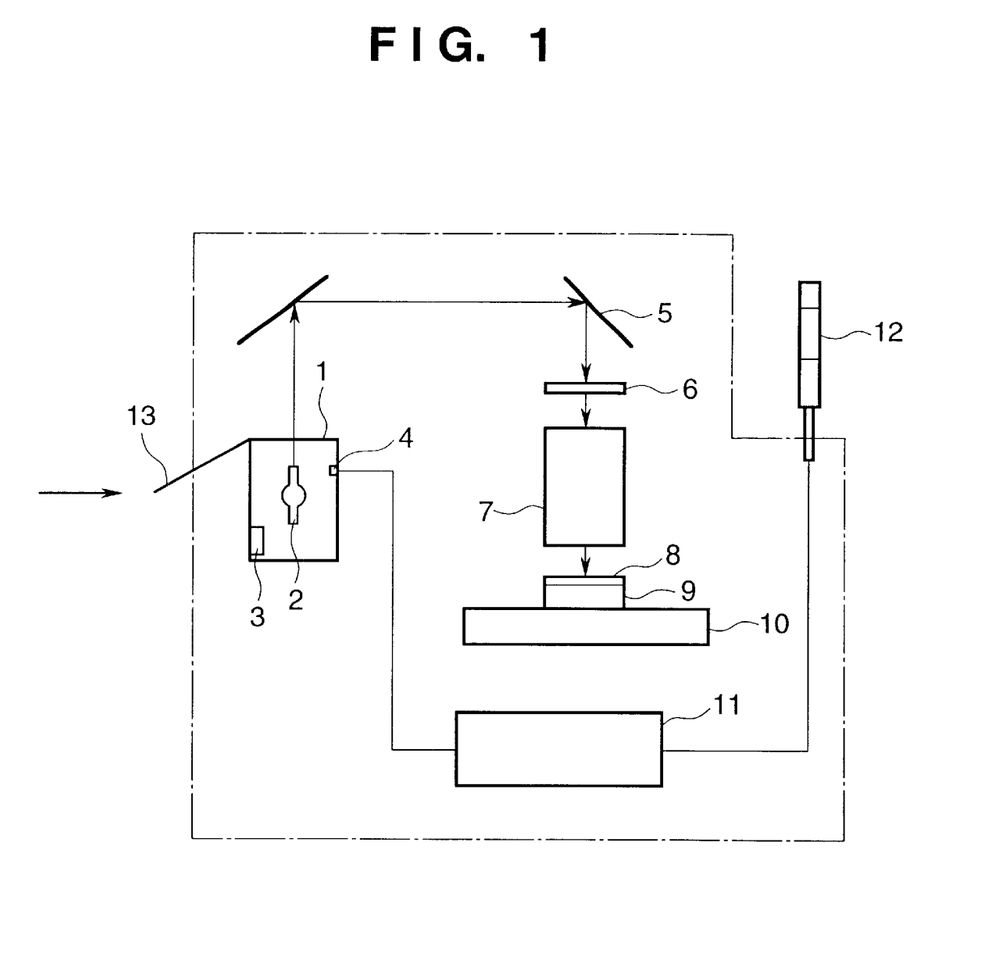
FIG. 1 is a view showing the schematic arrangement of a semiconductor exposure apparatus according to the first embodiment of the present invention.

FIG. 1 is a view showing the schematic arrangement of a semiconductor exposure apparatus according to the first embodiment of the present invention. As shown in FIG. 1, the semiconductor exposure apparatus of the first embodiment comprises a projecting lens 7 for reducing and projecting a semiconductor pattern drawn on a reticle 6, an X-Y stage 9 which moves while fixing a wafer 8 on which the semiconductor pattern is to be printed, an apparatus base plate 10 on which the X-Y stage 9 is mounted, a lamp 2 as a means for exposing the reticle 6, a lamp house 1 in which the lamp 2 is fixed, a movable portion 3 for fixing the exchange door of the lamp house 1, a sensor 4 for detecting the temperature in the lamp house 1, an illumination unit 5 for guiding light emitted by the lamp 2 to the reticle 6 to illuminate the reticle 6, a control section 11 for controlling the temperature detection operation in the lamp house 1, and an indicator 12 for informing the operator on the basis of the output from the sensor 4 that the temperature in the lamp house 1 has reached room temperature. The apparatus also has a means (not shown) for confirming the stop of the sequence of the exposure apparatus main body and outputting stop information representing it.

Figure 2:
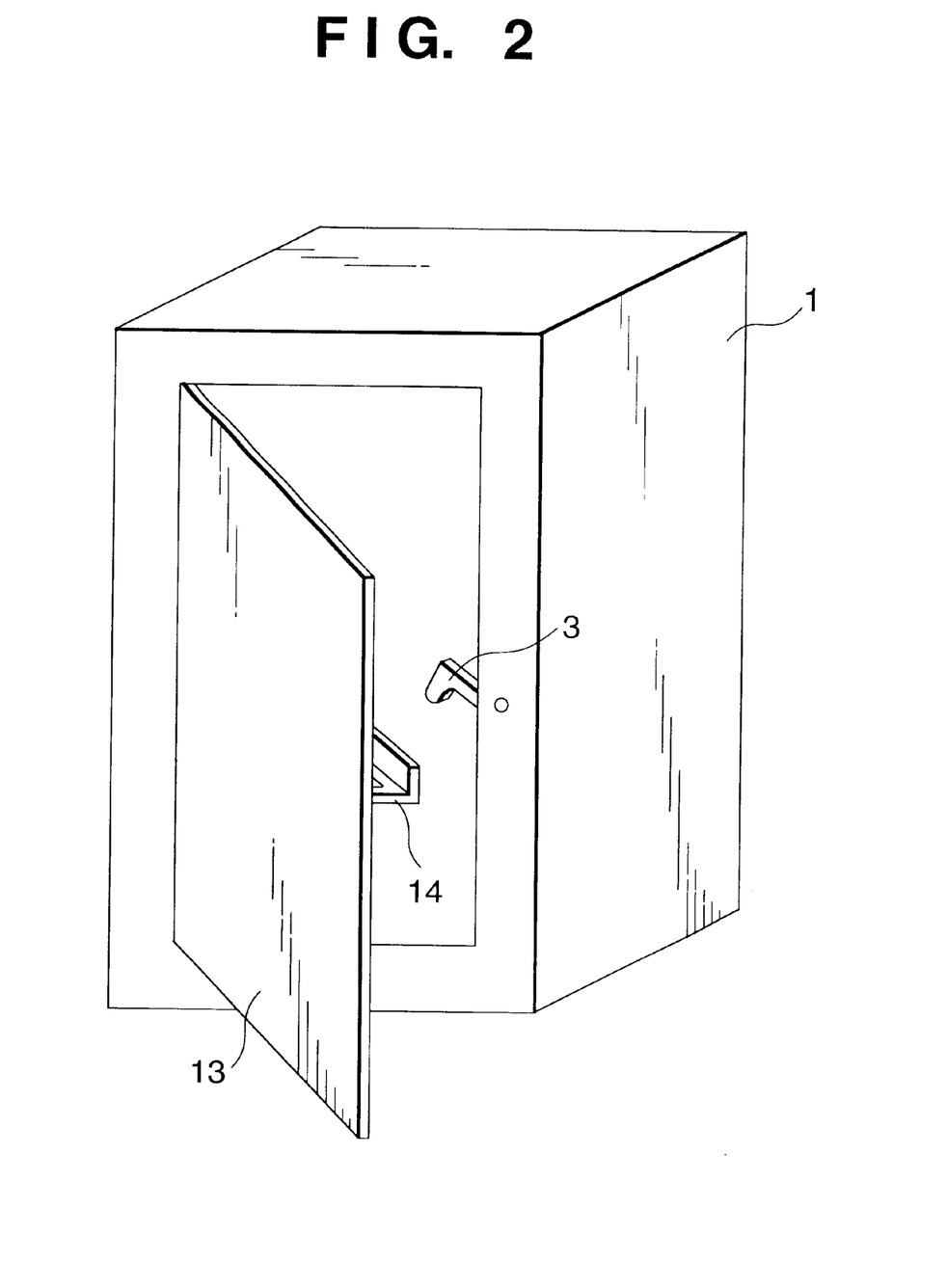
FIG. 2 is a view showing the positional relationship between the fixed portion and movable portion in a lamp exchange door of the lamp house of the semiconductor exposure apparatus shown in FIG. 1.

FIG. 2 is a view showing the fixed portion of the lamp exchange door of the lamp house 1. A fixed fitting 14 is attached to an exchange door 13 of the lamp house 1. The movable portion 3 is attached to the inner wall of the housing of the lamp house 1.

Figure 3A:
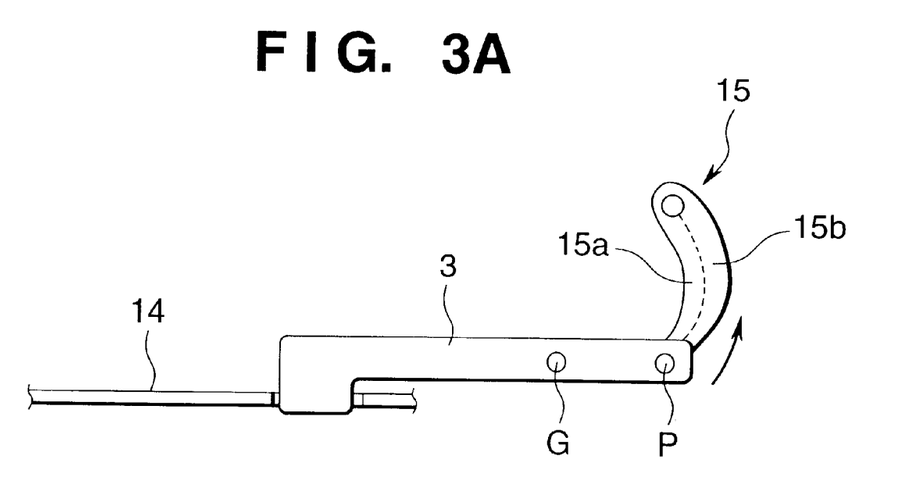
FIGS. 3A and 3B are views for explaining movement of the fixed and movable portions of the lamp exchange door.
Figure 3B:
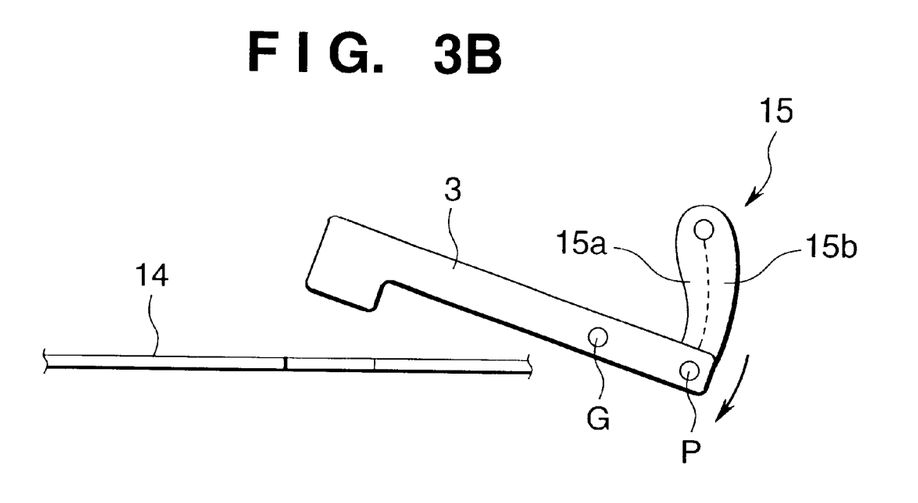

FIGS. 3A and 3B are views showing movement of the fixed fitting 14 and movable portion 3 of the lamp exchange door 13. As shown in FIGS. 3A and 3B, a driving element 15 formed from two metal members 15a and 15b is attached to one end portion of the movable portion 3. The movable portion 3 and driving element 15 are jointed at a pin joint P.

The metal members 15a and 15b have different thermal expansion coefficients. Letting $\alpha_a$ be the thermal expansion coefficient of the metal member 15a and $\alpha_b$ be the thermal expansion coefficient of the metal member 15b, $\alpha_b > \alpha_a$ holds. A barycenter G of the movable portion 3 is pivotally supported. The expansion amount difference between the metal members 15a and 15b is amplified by a lever function.

FIG. 3A shows the locked state of the exchange door 13. When the lamp 2 is ON, and the temperature in the lamp house 1 rises to 100° C. or more, the metal member 15b expands because the metal member 15b has a larger thermal expansion coefficient than that of the metal member 15a. Apparently, the driving element 15 curves and shrinks. The curve of the metal member 15 pulls up the joint P with respect to the movable portion 3 in a direction indicated by an arrow. For this reason, the movable portion 3 is fitted on the fixed metal portion 14 on the exchange door 13, so the exchange door 13 is locked.

FIG. 3B shows the unlocked state of the exchange door. When the lamp is turned off, and the temperature of the lamp 2 and lamp house 1 decreases to room temperature (about 40° C.), the metal member 15b shrinks. Apparently, the curve of the driving element 15 is canceled, so the entire driving element 15 expands to push the joint P down in a direction indicated by an arrow. In this state, the movable portion 3 is disengaged from the fixed fitting 14 on the exchange door 13. The exchange door 13 is unlocked so it can be freely opened/closed.

A change in temperature is measured by the sensor 4 in the lamp house 1 and converted into an electrical signal. The electrical signal output from the sensor 4 is sent to the temperature detection control section 11. The temperature detection control section 11 confirms whether the measured temperature in the lamp house 1 has reached the temperature (40° C. in this embodiment) at which the exchange door 13 is unlocked. When the temperature detection control section 11 confirms this temperature and stop information output from the means for outputting the stop information of the sequence of the exposure apparatus main body, it outputs a signal to cause the indicator 12 on the apparatus to indicate that the exchange door 13 can be opened. In this embodiment, the temperature at which the lamp house is locked is 100° C., and the temperature at which the lamp house is unlocked is 40° C. However, the present invention is not limited to these temperature conditions. The temperature conditions change depending on the thermal expansion coefficients of the metal members used. In addition, the members of the driving element which shrinks to drive the movable portion are not limited to metal members. Polymer materials may be used as far as they generate a difference in deformation amount because of the difference in thermal expansion coefficient.

(Second Embodiment)

Figure 4A:
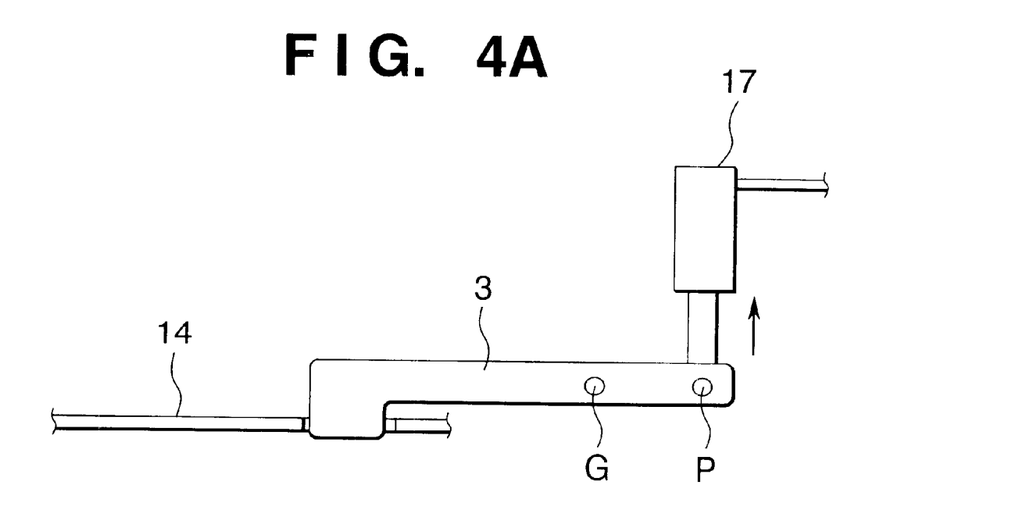
FIGS. 4A and 4B are views showing movement of the movable portion of a semiconductor exposure apparatus according to the second embodiment of the present invention.
Figure 4B:
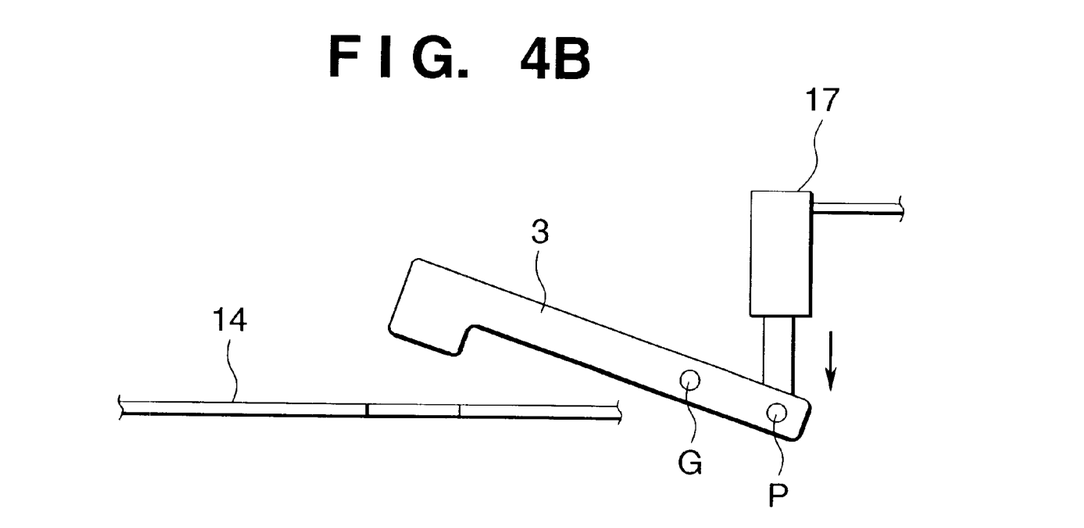

FIGS. 4A and 4B are views showing movement of the movable portion of an exposure apparatus according to the second embodiment of the present invention. The second embodiment is different from the first embodiment in that instead of driving a movable portion 3 using metals with different thermal expansion coefficients, an air cylinder is controlled in accordance with a signal from a temperature detection control section 11 on the basis of the detected temperature in a lamp house 1.

As shown in FIGS. 4A and 4B, an air cylinder 17 is attached to one end of the movable portion 3. A barycenter G of the movable portion 3 is pivotally supported. The movable portion 3 is jointed to the arm of the air cylinder 17 through a pin joint P. The expansion/retraction amount of the air cylinder 17 is amplified by a lever function. FIG. 4A shows the locked state of an exchange door 13. FIG. 4B shows the unlocked state of the exchange door 13.

Figure 5:
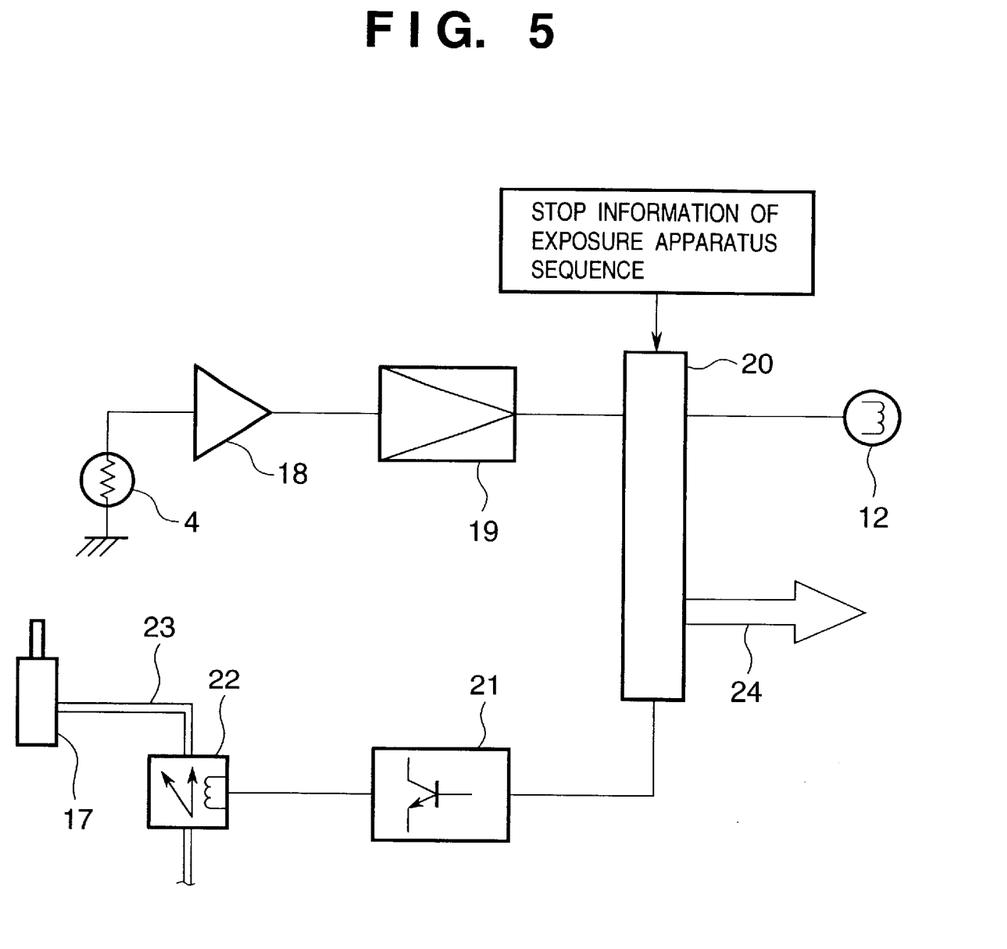
FIG. 5 is a block diagram showing the pneumatic pressure and electrical circuitries so as to explain processing by a temperature detection control section in the semiconductor exposure apparatus according to the second embodiment of the present invention.

FIG. 5 is a block diagram showing the pneumatic pressure and electrical circuitries of the temperature detection control section 11 of the second embodiment. An analog electrical signal from a temperature detection sensor 4 attached in the lamp house 1 is amplified by a preamplifier section 18 and input to an A/D conversion section 19. The input analog signal is converted into a digital signal by the A/D conversion section 19, and the digital signal is sent to a control CPU 20 of the temperature detection control section 11. The control CPU 20 reads the digital signal from the A/D conversion section 19 and detects the temperature in the lamp house 1. When the input digital signal represents a temperature (100° C. or more) indicating the ON state of a lamp 2, the control CPU 20 outputs a signal for fitting the movable portion 3 on the fixed metal portion 14 on the exchange door 13 to an electromagnetic valve driver 21. On the basis of the input signal, the electromagnetic valve driver 21 operates an electromagnetic valve 22 to flow air to an air pipe 23 and retract the arm of the air cylinder 17. When the arm of the air cylinder 17 retracts, the movable portion 3 is fitted on the fixed metal portion 14 on the door (FIG. 4A).

The temperature in the lamp house is measured by the sensor 4. When the lamp 2 is turned off, and the temperature of the lamp 2 and lamp house 1 decreases to room temperature (about 40° C.), the digital signal input from the temperature detection sensor 4 to the control CPU 20 represents the temperature (about 40° C.) in the OFF state of the lamp 2. When the control CPU 20 confirms that stop information is output from a means for outputting stop information of the sequence of the exposure apparatus main body, it outputs a signal for disengaging the movable portion 3 from the fixed metal portion 14 on the exchange door 13 to the electromagnetic valve driver 21. On the basis of this signal, the electromagnetic valve driver 21 operates the electromagnetic valve 22 to flow air to an air pipe 23 reversely to the direction in which the arm of the air cylinder 17 retracts, and to expand the arm of the air cylinder 17. When the arm of the air cylinder 17 expands, the movable portion 3 is disengaged from the fixed metal portion 14 on the door, so the exchange door 13 can be freely opened/closed. Simultaneously, the control CPU 20 reconfirms whether the measured temperature in the lamp house 1 has reached the temperature (40° C. in this embodiment) at which fixing of the exchange door 13 is canceled. When this temperature is detected, the temperature detection control section 11 outputs a signal for making an indicator 12 on the apparatus indicate it and also notifies the host CPU through a communication line 24 that preparation for lamp exchange is complete.

(Third Embodiment)

Figure 6:
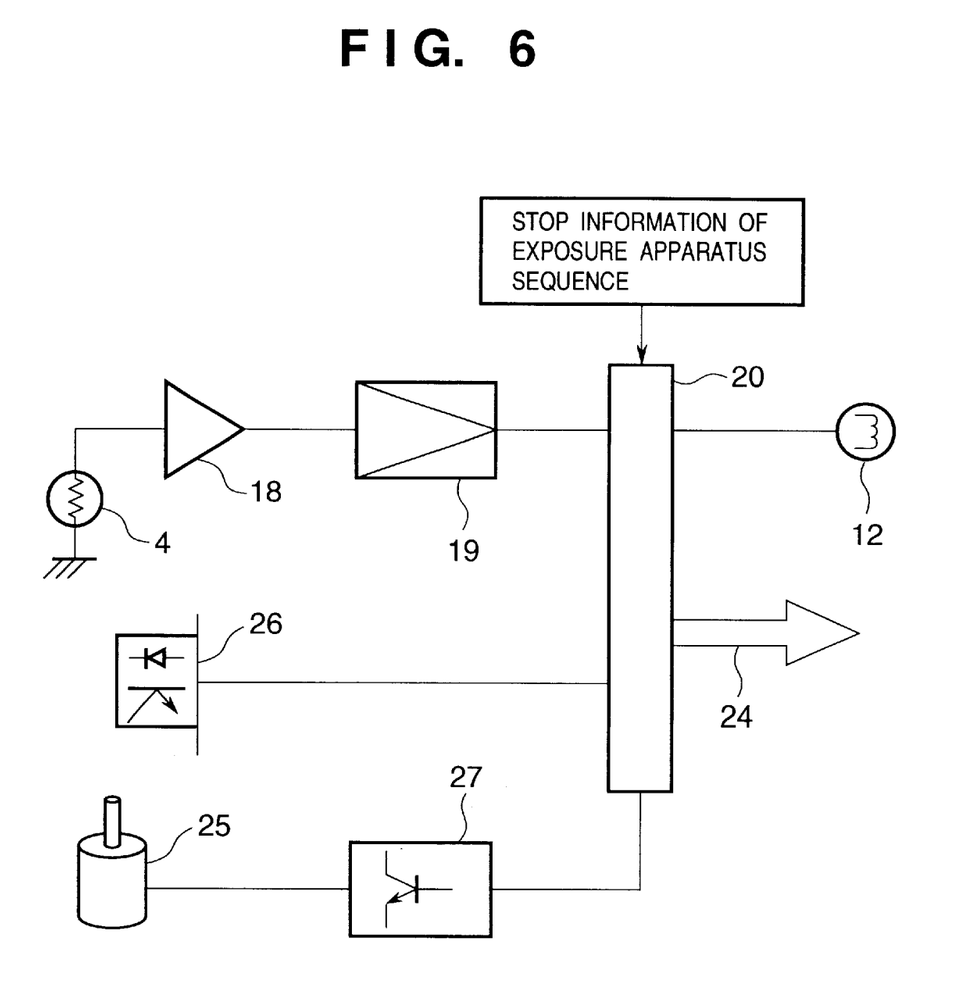
FIG. 6 is a block diagram showing the electrical circuitries so as to explain processing by a temperature detection control section for controlling the movable portion of a semiconductor exposure apparatus according to the third embodiment of the present invention.

FIG. 6 is a block diagram showing the electrical circuitries so as to explain processing by a temperature detection control section for controlling the movable portion of a semiconductor exposure apparatus according to the third embodiment of the present invention. The third embodiment is different from the second embodiment in the means for driving a movable portion 3. More specifically, in the second embodiment, the air cylinder is used as the driving source of the movable portion 3. In the third embodiment, however, a DC actuator 25 is used. In this embodiment, the DC actuator 25 is attached to one end of the movable portion 3. As in the second embodiment, a barycenter G of the movable portion 3 is pivotally supported, so a fine movement of the DC actuator 25 is amplified by a lever function.

In the arrangement shown in FIG. 6, an analog electrical signal from a temperature detection sensor 4 attached in a lamp house 1 is amplified by a preamplifier section 18 and input to an A/D conversion section 19. The input analog signal is converted into a digital signal by the A/D conversion section 19, and the digital signal is sent to a control CPU 20 of a temperature detection control section 11. The control CPU 20 reads the digital signal from the A/D conversion section 19 and detects the temperature in the lamp house 1. When the input digital signal represents a temperature (100° C. or more) indicating the ON state of the lamp, the control CPU 20 outputs a signal for fitting the movable portion 3 on the fixed metal portion 14 on an exchange door 13 to a DC actuator driver 27 (FIG. 6). On the basis of this signal, the DC actuator driver 27 operates the DC actuator 25 to retract the arm of the DC actuator 25. An arm position sensor 26 is attached near the arm to detect whether the position of the arm of the DC actuator 25 is normal. When the control CPU 20 confirms on the basis of a signal from the arm position sensor 26 that the arm of the DC actuator 25 has retracted, it outputs a driving stop signal to the DC actuator driver 27 to stop driving the DC actuator 25. With this operation, the arm of the DC actuator 25 retracts to fit the movable portion 3 on the fixed metal portion 14 on the door.

When the lamp 2 is turned off, and the temperature of the lamp 2 and lamp house 1 decreases to room temperature (about 40° C.), the digital signal input to the control CPU 20 represents the temperature (about 40° C.) in the OFF state of the lamp 2. When the control CPU 20 confirms that stop information is output from a means for outputting stop information of the sequence of the exposure apparatus main body, it outputs a driving signal for disengaging the movable portion 3 from the fixed metal portion 14 on the exchange door 13 to the DC actuator driver 27. On the basis of this driving signal, the DC actuator driver 27 operates the DC actuator 25 to expand its arm. When the control CPU 20 confirms on the basis of a signal from the arm position sensor 26 that the arm of the DC actuator 25 has expanded, it outputs a driving stop signal to the DC actuator driver 27 to stop driving the DC actuator 25. With this operation, the movable portion 3 is disengaged from the fixed metal portion 14 on the door, so the exchange door 13 can be freely opened/closed. Simultaneously, the control CPU 20 reconfirms whether the measured temperature in the lamp house 1 has reached the temperature (40° C. in this embodiment) at which fixing of the exchange door 13 is canceled. When this temperature is detected, the temperature detection control section 11 outputs a signal for making an indicator 12 on the apparatus indicate it and also notifies the host CPU through a communication line 24 that preparation for lamp exchange is complete.

As the "actuator", a solenoid for linearly driving the movable iron core in a coil can be used. In the third embodiment, an actuator using a DC power supply has been exemplified. However, a driving source using an AC power supply may be used. The present invention is not limited in respect to the attribute of a power supply. According to the third embodiment, since a small displacement can be amplified by the principle of a lever, a piezoelectric actuator or electrostatic actuator may be used.

<Embodiment of Device Manufacturing Method>

Figure 7:
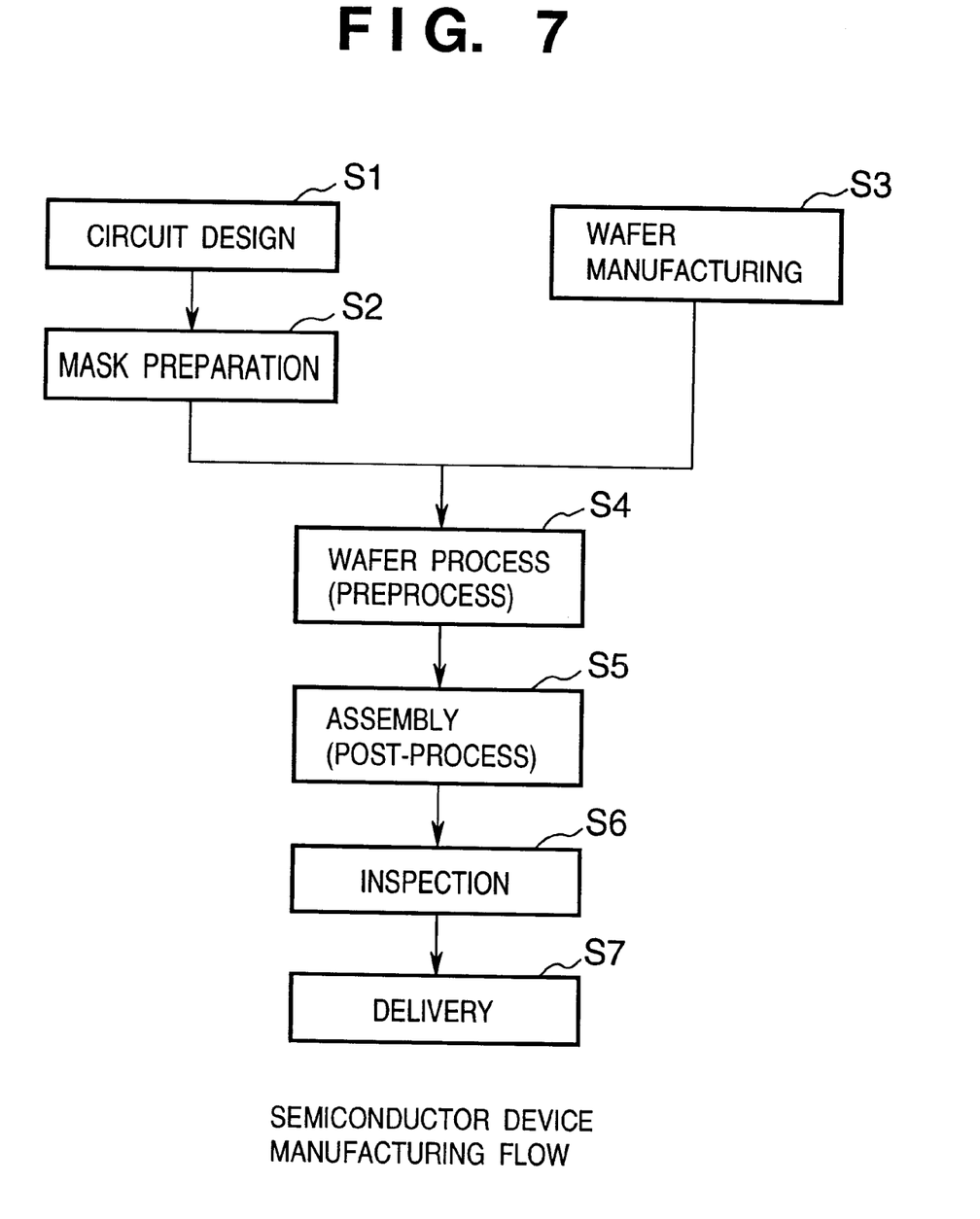
FIG. 7 is a flow chart showing a device manufacturing method using the exposure apparatus of the present invention.

An embodiment of a device manufacturing method using the above-described exposure apparatus will be described next. FIG. 7 shows the flow of manufacturing a microdevice (e.g., a semiconductor chip such as an IC or an LSI, a liquid crystal panel, a CCD, a thin-film magnetic head, or a micromachine). In step 1 (circuit design), the pattern of a device is designed. In step 2 (mask preparation), a mask having the designed pattern is prepared. In step 3 (wafer manufacturing), a wafer is manufactured using a material such as silicon or glass. In step 4 (wafer process) called a preprocess, an actual circuit is formed on the wafer by lithography using the prepared mask and wafer. In step 5 (assembly) called a post-process, a semiconductor chip is formed from the wafer prepared in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and delivered (step 7).

Figure 8:
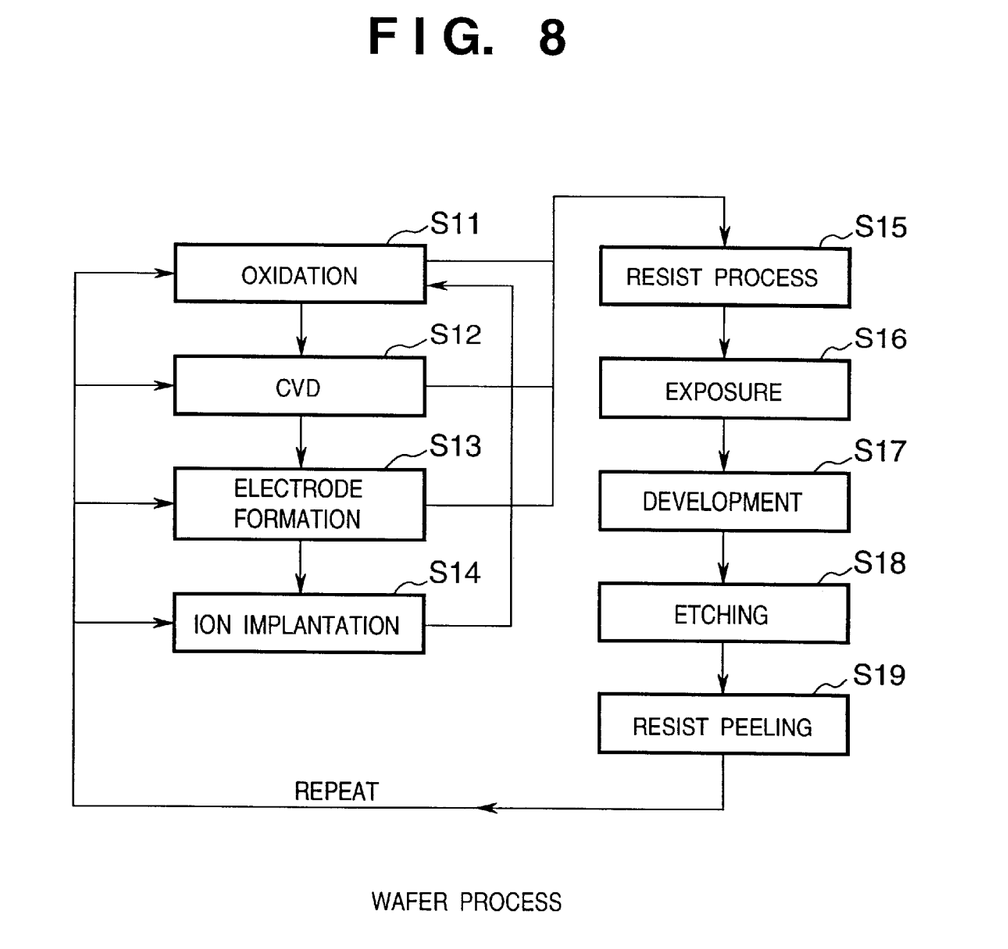
FIG. 8 is a flow chart for explaining the detailed flow of a wafer process of the device manufacturing method.

FIG. 8 shows details of the wafer process (step 4). In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a resist is applied to the wafer. In step 16 (exposure), the circuit pattern of the mask is printed in each of a plurality of shot regions on the wafer by exposure using the above-described exposure apparatus or exposure method. In step 17 (development), the exposed wafer is developed. In step 18 (etching), portions other than the developed resist image are etched. In step 19 (resist peeling), the resist unnecessary after etching is removed. By repeating these steps, a multilayered structure of circuit patterns is formed on the wafer.

When the production method of this embodiment is used, a large-scaled device which is conventionally difficult to manufacture can be manufactured at low cost.

As has been described above, according to the present invention, the exposure apparatus comprises a means for detecting the lamp temperature information and a means for confirming a stop of the sequence of the exposure apparatus main body and outputting stop information representing it, or a means for indicating information representing whether the door can be opened, on the basis of the temperature information. With this arrangement, the operation efficiency of the apparatus can be improved by minimizing the apparatus stop time. In addition, the operation load on the operator can be reduced to improve the operation efficiency. Furthermore, an environment for preventing any accident such as a burn during operation can be provided.

Also, since the exchange door lock mechanism unlocks the door on the basis of the temperature of the illumination lamp, safety in an exchange operation can be improved with an inexpensive arrangement.

The present invention is not limited to the above embodiments and various changes and modifications can be made within the spirit and scope of the present invention. Therefore, to apprise the public of the scope of the present invention, the following claims are made.

What is claimed is:

1. An exposure apparatus having a maintenance door for an exposure illumination lamp, said apparatus comprising:
   means for detecting temperature information of the lamp and for outputting the detected temperature information;
   means for confirming a stop of an operation sequence of said exposure apparatus and for outputting a confirmation result; and
   means for controlling a lock mechanism of the maintenance door on the basis of the temperature information and the confirmation result.

2. The apparatus according to claim 1, wherein said lock mechanism comprises an air cylinder as a driving source.

3. The apparatus according to claim 1, wherein said lock mechanism comprises a DC actuator as a driving source.

4. The apparatus according to claim 1, wherein said means for detecting the temperature information detects, using a sensor, a temperature of the lamp as the temperature information.

5. The apparatus according to claim 1, wherein said means for detecting the temperature information detects, using a sensor, a temperature at a position at which the lamp is exchanged.

6. A device manufacturing method comprising the steps of:
   providing the exposure apparatus of claim 1; and
   manufacturing a device by exposing the device using the exposure apparatus.

7. An exposure apparatus having a maintenance door for an exposure illumination lamp, said apparatus comprising:
   means for confirming an operation sequence of the exposure apparatus and for outputting a result of the confirmation; and
   lock means for locking and unlocking the door, wherein said lock means actively locks or unlocks the door on the basis of (i) a change in temperature in an ON or OFF state of the illumination lamp and (ii) the confirmation result of the operation sequence.

8. The apparatus according to claim 7, further comprising a member that shrinks or expands and deforms due to a change in temperature, wherein said lock means actively locks or unlocks the door in response to the member deforming due to a change in temperature.

9. The apparatus according to claim 7, further comprising:

means for detecting the change in temperature in the ON or OFF state of the illumination lamp and for outputting a detection result; and means for notifying an operator of an appropriate time for exchanging the lamp on the basis of the detection result.

10. A device manufacturing method comprising the steps of:

providing the exposure apparatus of claim 7; and manufacturing a device by exposing the device using the exposure apparatus.

11. A device manufacturing method comprising:

a step for detecting temperature information of an exposure illumination lamp and outputting a detection result;

a step for confirming stop information of an operation sequence of an exposure apparatus and outputting a confirmation result; and a step for controlling a lock mechanism of a maintenance door of the exposure illumination lamp on the basis of the detection result and the confirmation result.

12. A method for controlling a lock mechanism of a maintenance door of an exposure illumination lamp in an exposure apparatus, said method comprising:

a step for detecting temperature information of the exposure illumination lamp and outputting a detection result;

a step for conforming stop information of an operation sequence of the exposure apparatus and outputting a confirmation result; and a step for controlling a lock mechanism of a maintenance door of the exposure illumination lamp on the basis of the detection result and the confirmation result.

* * * * *

UNITED STATES PATENT AND TRADEMARK OFFICE
CERTIFICATE OF CORRECTION

PATENT NO. : 6,337,732 B2
DATED : January 8, 2002
INVENTOR(S) : Gen Nakamura

It is certified that error appears in the above-identified patent and that said Letters Patent is hereby corrected as shown below:

Column 2,
Line 30, the first occurrence of "the" should be deleted.

Column 4,
Line 39, "Abarycenter G" should read -- A barycenter G --.

Column 10,
Line 4, "for" should read -- of --.
Line 11, "conforming" should read -- confirming --.

Signed and Sealed this

Fourth Day of June, 2002

Attest:

JAMES E. ROGAN
Attesting Officer    Director of the United States Patent and Trademark Office